United States Patent [19]
Bross et al.

[11] Patent Number: 5,303,862
[45] Date of Patent: Apr. 19, 1994

[54] SINGLE STEP ELECTRICAL/MECHANICAL CONNECTION PROCESS FOR CONNECTING I/O PINS AND CREATING MULTILAYER STRUCTURES

[75] Inventors: Arthur Bross, Poughkeepsie, N.Y.; James J. Hedrick, Oakland; Robert D. Johnson, Morgan Hill, both of Calif.; Robert O. Lussow, Hopewell Junction, N.Y.; James R. Lyerla, Jr., San Jose, Calif.; Donald E. Myers, Poughkeepsie, N.Y.; Joseph D. Peruffo, Pleasant Valley, N.Y.; Krishna G. Sachdev, Hopewell Junction, N.Y.; Thomas J. Walsh, Poughkeepsie, N.Y.

[73] Assignee: International Business Machines Corporation, Armonk, N.Y.

[21] Appl. No.: 999,440

[22] Filed: Dec. 31, 1992

[51] Int. Cl.5 .............................................. H05K 3/30
[52] U.S. Cl. ................................................... 228/175
[58] Field of Search ............... 228/175, 180.2; 29/830; 361/412, 414, 426; 174/259

[56] References Cited

U.S. PATENT DOCUMENTS

| | | | |
|---|---|---|---|
| 4,157,932 | 6/1979 | Hirata | 29/830 X |
| 4,751,126 | 6/1988 | Oodaira et al. | 29/830 X |
| 5,031,308 | 7/1991 | Yamashita et al. | 29/830 |
| 5,046,238 | 9/1991 | Daigle et al. | 29/830 |
| 5,199,163 | 4/1993 | Ehrenberg et al. | 29/830 |

*Primary Examiner*—Kenneth J. Ramsey
*Attorney, Agent, or Firm*—Whitham & Marhoefer

[57] ABSTRACT

A single step electrical/mechanical connection process utilizes an adhesive layer (3 or 26) that is patterned on a substrate (1 or 21) to mechanically connect adjacent substrates in a multilayered structure (28) or to connect a pin (2) assembly to a device (5). In a preferred embodiment, the adhesive layer (3 or 26) and substrate (1 or 21) are made from materials which will undergo transesterification under heat and pressure to create a very strong bond therebetween. The adhesive layer (3 or 26) is positioned around and does not cover the solder (4) in the pin connector assembly or the alignment holes (24) in the molding/sheet (21), thereby allowing bonding metallurgy to make positive electrical connections between pins (2) and pads (6) and adjacent spheres (22) in a multilayered structure (28).

10 Claims, 2 Drawing Sheets

SINGLE STEP ELECTRICAL/MECHANICAL CONNECTION PROCESS FOR CONNECTING I/O PINS AND CREATING MULTILAYER STRUCTURES

BACKGROUND OF THE INVENTION

1. Field of the Invention

The invention is generally related to a process used in the fabrication of electrical components wherein electrical connections and mechanical connections are formed in the components in a single step.

2. Description of the Prior Art

For the past several years, efforts have been made to miniaturize electrical components such as circuit boards, semiconductor substrates and chips, ceramic packages, etc. A popular technique has been to create multilayered devices where each layer can contain circuit patterns and circuit devices. The circuit patterns and circuit devices on individual layers are interconnected by electrically conducting vias which pass through the individual layers. As miniaturization has progressed, fabricating the multilayered structures has become more complex, and circuitry and circuit devices have become increasingly more dense. A practical problem in creating multilayered devices which function properly is to assure that the layers remain connected together mechanically and that the circuitry and electrical components in the various layers remain connected electrically. Furthermore, connecting pins and other mechanical connectors to the connection pads on the multilayered devices has proved difficult because of the close spacing between the pads which results from dense circuitry.

U.S. Pat. No. 4,648,179 to Bhattacharyya et al. discloses a process for making a multilayered structure with interconnected electronic circuitry. Specifically, Bhattacharyya et al. disclose the fabrication of decal-like interconnection structures which include a central polymeric film, a circuit pattern formed on one surface of the polymeric film, metal filled vias created through the polymeric film connected to selected components of the circuit pattern, and a partially cured polymeric film located on the opposite surface of the polymeric film from the circuit pattern. The partially cured polymeric film is selectively removed from via areas to expose bonding metallurgy. The decal-like interconnection structures are then placed adjacent a substrate, such as a chip or the like, or adjacent other decal-like interconnection structures, with the exposed bonding metallurgy of the metal filled vias aligned with pads or circuitry of the adjacent substrate or decal-like interconnection structure. The entire package is then subjected to heat and compression to simultaneously form metal-to-metal, film-to-film, and film-to-substrate bonds. The polymeric films of the decal-like layers are directly bonded together by curing of the partially cured adhesive layer under temperature and pressure conditions in the press, and the finished structure resembles a thick polymeric film with circuitry positioned at varying levels within the film.

Japanese Application J6 0072-663-A discloses the use of solder balls to interconnect two printed circuit boards (PCBs). A protective sheet with a plurality of holes is positioned on a first PCB and solder balls with diameters larger than the holes are deposited in the holes in the protective sheet. A second PCB is then aligned with solder balls and electrically connected to the first PCB by applying heat to the combined structure.

U.S. Pat. No. 5,031,308 to Yamashita et al. discloses methods of manufacturing multilayered PCBs. In a particular method, individual layers are formed which include an overcoating of a partially cured polymer resin and solder bumps protruding through the overcoating. The solder bumps are formed on circuitry underneath the overcoating. The individual layers are subsequently compressed together and, through heat and pressure, the solder bumps and overcoatings on adjacent layers fuse together to create a polymer interlayer between adjacent layers with metal filled vias formed from the solder balls passing through the interlayer. Yamashita et al. also shows that the vias in the interlayer can be created from solder bumps that do not protrude through the overcoating on the individual layers which are used initially.

SUMMARY OF THE INVENTION

It is an object of this invention to provide an improved method for fabricating a multilayered electrical structure where mechanical and electrical connections between the individual layers are formed in a single step.

It is another object of this invention to prepare several individual layers, each with a plurality of electrically conductive spheres positioned therein and circuitry connected to the spheres, and to join the individual layers to form a multilayer structure where the spheres function as vias in the multilayer structure produced.

It is yet another object of this invention to provide a method for mechanically and electrically connecting a plurality of pins to pads on a substrate with densely formed circuitry.

It is still another object of this invention to utilize heat and pressure to achieve transesterification between a polymeric substrate and an interlayer that provides a good mechanical connection for input/output (I/O) pins and a good mechanical connection between adjacent layers of a multilayer structure.

According to the invention, a polymeric substrate has on at least one surface a plurality of solder sites and a thin polymer layer which acts as an adhesive film which surrounds the solder sites, but does not cover them. The solder sites can be present as solder balls protruding from the polymeric substrate or may be joined to I/O pins or other mechanical connecters. The solder sites can also be electrically connected to circuitry on the polymeric substrate. The polymeric substrate is placed adjacent a similar polymeric substrate, electrical component, or other device where the solder sites on the polymeric substrate are in registry with connection pads, vias, or connectors in the adjacent device. The polymeric substrate and adjacent device are then compressed together and heated to reflow and fuse the solder at the solder site on the polymer substrate with the connection pads, vias, or connectors of the adjacent device. Simultaneously, the polymer layer, which serves as an interlayer between the polymeric substrate and adjacent device, undergoes a transesterification reaction with the polymeric substrate and has strong interaction with the adjacent device, thereby creating a strong mechanical interconnection between lamina. The polymer layer surrounds and protects the fused solder site. In a particularly preferred embodiment, the polymeric substrate includes a liquid crystal polymer (LCP) and the polymer layer is a polyester or like material. Transesterification between the polyester of the polymer layer and the LCP in the polymeric substrate forms an extremely strong bond since a chemical bond between the polymer layer and the polymeric substrate is formed, not merely a physical interlocking or mechanical interaction between the polymer layer and the polymeric substrate.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 1A:
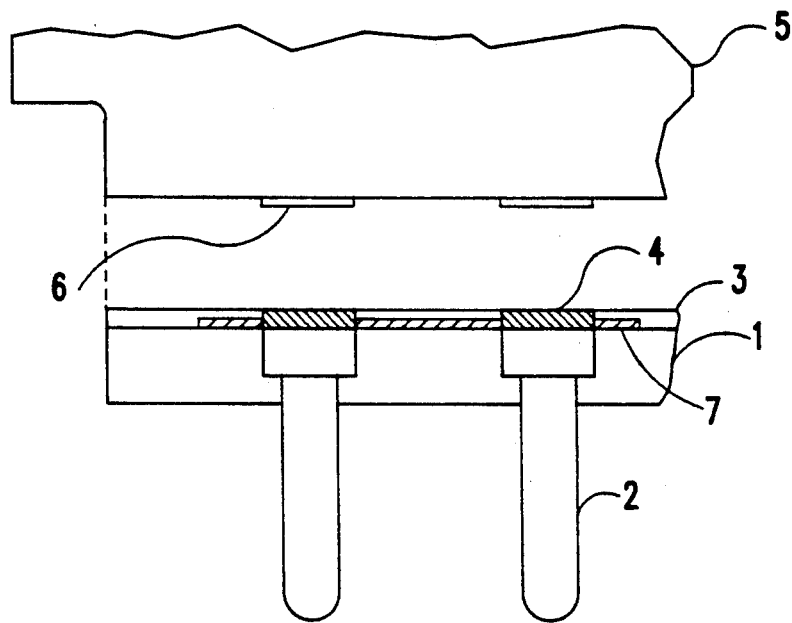
FIGS. 1a and 1b are sequential cross-sectional side-views of a polymeric substrate with a plurality of pin connectors being joined to an electrical component.
Figure 1B:
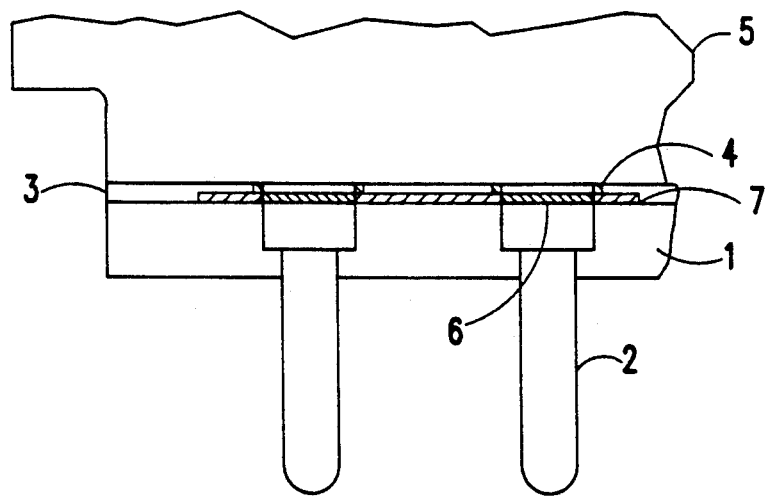

Referring now to the drawings, and more particularly to FIGS. 1a and 1b, there is shown a substrate 1 having a plurality of pins 2 positioned therein. The substrate 1 can be a polymeric card, layer, sheet, or the like, and can comprise a single layer or multiple layers fused together. The pins 2 can be pressed, staked, molded, or positioned by other means in the substrate 1. While FIG. 1a shows only two pins 2, it should be understood that many pins can be joined using this process. Metalization 7 can be applied on the substrate 1 surface and can function as interconnection circuitry. Applying the metalization 7 can be performed by a number of different well known techniques including spray or dip overcoating the substrate 1 followed by etch patterning. The metalization 7 can be positioned directly over the pins 2 or simply up to the pins 2, and the metalization 7 can be applied before or after pin 2 insertion in substrate 1. A polymer layer 3 is applied on the substrate 1 and solder or braze 4 is positioned at the top of the pins 2. The solder or braze 4 can be applied to the pins 2 prior to or after they are inserted in substrate 1, and preferably is a eutectic or alloy solder or braze comprised of appropriate mixtures of lead, tin, bismuth, aluminum, copper, gold, silver and/or nickel. The polymer layer 3 surrounds the solder 4 and does not extend over the top of the solder 4; however, it does cover, insulate and protect the underlying metalization 7. The polymer layer 3 can be applied by well known screening or squeegeeing operations or by forming the polymer layer as a "punched" sheet whereby the sheet is placed on the substrate 1 with registered holes surrounding the solder 4.

An electronic device 5, which can be a integrated circuit (IC) chip, semiconductor substrate, multilayered structure or card, chip carrier, or any other device, having connection pads 6 is joined to the substrate both electrically and mechanically in a single operation by compressing the electronic device 5 and substrate 1 together and heating the combined package. After registration of the solder 4 with the connection pads 6, the compressing and heating operation causes the solder 4 to reflow and fuse to the connection pads 6 as well as causes the polymer layer 3 to firmly fuse together with the device 5 and to form a strong chemical bond with the substrate 1.

An important feature of this invention is the chemical bond between the polymer layer 3 and the substrate 1 which is formed during the heating operation. Specifically, the polymer layer 3 and substrate 1 are capable of transesterification chemistry between each other to promote a very strong chemical bond therebetween. The device 5 might also be chosen to undergo transesterification with the polymer layer 3. Transesterification is often called alcoholysis, or cleavage by an alcohol, where the alcohol on one ester is exchanged with an alcohol group or alcohol on another ester. Particularly preferred materials for achieving transesterification chemistry during the compressing and heating operation would be polyesters and liquid crystalline polyesters. Suitable examples include low molecular weight (oligomeric) aromatic copolyesters such as hydroxybenzoic acid/hydroxynaphthoic acid, hydroxybenzoic acid/ethyleneterephthalate, hydroxybenzoic acid/biphenylterephthalate, and a variety of aromatic homo or copolyesters with spacer units, such as methylene units. Liquid crystalline polyesters, including high molecular weight aromatic copolyesters such as Xydar® available from Amoco, Vectra® available from Hoechst Celanese, and the like, would be preferred for the substrate 1, since they have high strength and rigidity and would therefore be optimum for holding pins 2 in position. Preferred liquid crystalline polyesters would have high molecular weight with phase transitions above 300° C. Preferably the polymeric layer 3 would be a low molecular weight aromatic copolyester or homopolyester which may, in some cases, form liquid crystalline (nematic) phases. Specifically, the low temperature nematic phase transition is a transition that readily yields a viscosity that allows uniform contact between bonding surfaces and rapid interconnection via transesterification reactions. When the substrate 1 is a multilayered component, the substrate would be made to have at least some liquid crystalline polyester at its top surface.

The finished package shown in FIG. 1b has the polymer layer 3 surrounding and protecting the solder 4 which connects the pins 2 to the pads 6. The process is especially useful in connecting pins 2 to devices 5 with densely packed circuitry since a very strong mechanical connection of the substrate 1 to the device 5 is accomplished with the polymer layer 3 and movement of the pins 2 is significantly reduced. Thus, the present process overcomes prior art problems of joining multiple pins 2 to closely spaced pads 6 of device 5 since the adhesive layer 3 assures that the pins 2 will remain mechanically functional when attempting to connect the pins 2 to a PCB, connector harness, or other device. The spacing of the pins 2 is limited by their size, and good mechanical and electrical connections can be achieved with very high pin densities (e.g., 225 pins per square inch) using this technique. Preferably, once the polymer layer 3 is heated above its glass transition temperature (Tg) (e.g., 50° C. to 70° C. for a number of polyesters), it will have excellent adhesive characteristics to metals, polyesters, ceramic substrates, polyester composites, etc. The pressure and heat which are applied in the single step mechanical/electrical connection are a function of the materials used in the substrate 1, device 5, metalization 7, solder 4, and polymer layer 3. The pressure and heat should be sufficient to reflow the solder 4 and activate the polymer layer 3 for transesterification, but not so high as to damage the device 5, substrate 1, or metalization 7. The flow temperature for the polymer layer 3 and solder 4 should be approximately the same to provide ease of processing. Pressures ranging between 10 psi and 1000 psi, and temperatures ranging between 75° C. and 350° C. are preferable.

FIGS. 2a through 2d show the fabrication of a multilayered structure using the process of this invention. Specifically, multilayered substrates, moldings, sheets, or the like, with conductive vias, are formed by mass connecting a number of individual layers or sheets through the application of pressure and heat.

Figure 2A:
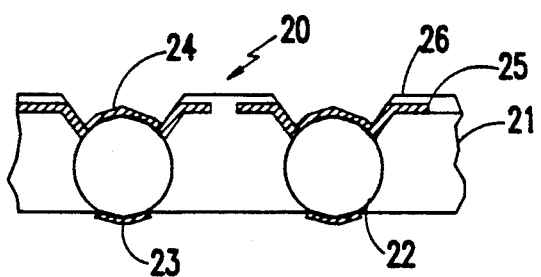
FIGS. 2a through 2d are cross-sectional side-views of individual layers used in the fabrication of a multilayered circuit component.

FIG. 2a shows a layer 20, which includes a molding, sheet, or like element 21 made from a polymeric, ceramic or composite material, with a plurality of conductive via spheres 22 positioned therein. Like the substrate 1 described above in conjunction with FIG. 1a, the molding/sheet 21 is made of a material or overcoated with a material which is capable of transesterification. The conductive via spheres 22 can be either molded in or pressed in the molding/sheet 21 as is described in the co-pending U.S. patent applications having Ser. No. 07/863,645, filed Apr. 3, 1992, which is herein incorporated by reference. The spheres 22 can be made from copper, silver, alloys, or other conductive materials, and can be on the order of 2-50 mils in diameter. The spheres 22 can be very densely populated in the molding/sheet 21 and good results can be obtained at a population of 40,000 spheres per square inch of molding/sheet 21. In a preferred embodiment, the spheres 22 are copper, copper alloy, or another high melting point conductive material which does not melt under the application of heat and pressure which is employed in this process.

It should be understood that spheres 22 are shown for illustrative purposes only. Shaped components, slugs, molded in pads, and other elements could be readily substituted for the spheres 22 and serve as the interconnection vias in the multilayer package formed according to the present invention.

An alloy or eutectic solder 23, which can be copper, aluminum, iron, nickel, silver, gold, or other material, is positioned on the exposed under surface of the sphere 22 and may also be deposited on the top surface of the sphere 22 in alignment hole 24. The solder 23 can be clad on sphere prior to its insertion in molding/sheet 21 or be applied after insertion. Having an exposed under surface of the sphere 22 and an alignment hole 24 in the layer 20 helps in registering each individual layer 20 with adjacent layers. Metalization 25 can be applied on the surface of the molding/sheet 21 and can function as interconnect circuitry for circuits and devices on the layers 20. The metalization 25 can be applied by well known coating and patterning techniques and may extend over or up to spheres 22 in the alignment holes 24, and it may be applied before or after insertion of the spheres 22 in the molding/sheet 21.

A polymer layer 26 is patterned over the molding/sheet 21 and metalization 25 using screening, squeegeeing or other procedures (e.g., laying a sheet of polymer layer 26 with registery holes for the metalization on the molding/sheet 21). As discussed above with the pin connections in FIG. 1a, the polymer layer 26 is patterned to cover and protect the metalization 25, but does not cover the alignment hole 24. The polymer layer 26 is selected to undergo transesterification chemistry with the molding/sheet 21. Suitable materials for the polymer layer 26 and molding/sheet 21 are described above. Preferably, the polymer layer is a polyester or low melting temperature liquid crystalline polyester or blend including low molecular weight aromatic copolyesters or homopolyesters which may in some cases form liquid crystalline phases, or the like, and the molding sheet is made of or overcoated with a liquid crystalline polyester including high molecular weight aromatic copolyesters such as Xydar, Vectra, and the like.

Figure 2B:
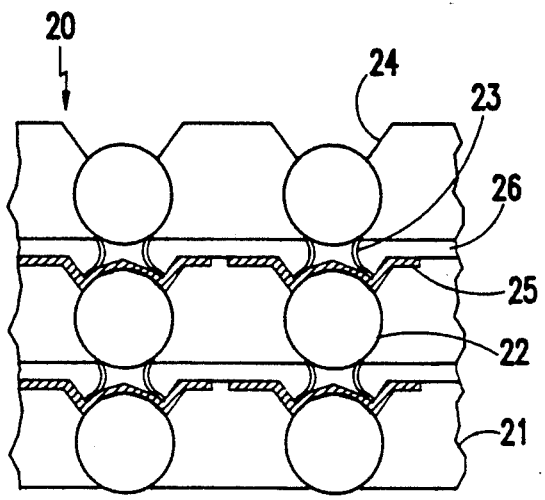
Figure 2C:
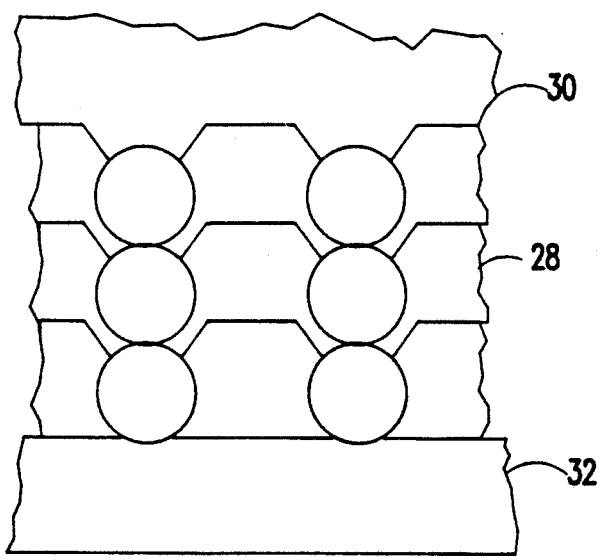

FIG. 2b and 2c show a plurality of layers 20 which have been aligned using the under surface of the sphere 22 cooperating with the alignment holes 24 in adjacent layers. FIG. 2c shows the multilayered structure 28 in a press with a conforming upper platen 30 and lower platen 32. By compressing the stack of layers 20 and applying heat, the solder 23 is caused to reflow and fuse adjacent spheres for a good electrical connection and the polmer layer 26 is activated to undergo transesterification with the material in or on the molding/sheet 21. The temperatures and pressures used in forming the multilayered device should be sufficient to cause solder 23 reflow and polymer layer 26 activation, but not so excessive as to damage the metalization 25, spheres 22, or molding/sheets 21. A controlled heat and pressure profile which would generally meet this criteria would be as follows: 25° C., 150° C., 25° C., where the time at each temperature depends on thickness and heat capacity of package and using a static pressure of 100 psi throughout the cycle. The spheres 22 in the resulting multilayered structure 28 could be touching each other or electrically joined by the solder 23.

Figure 2D:
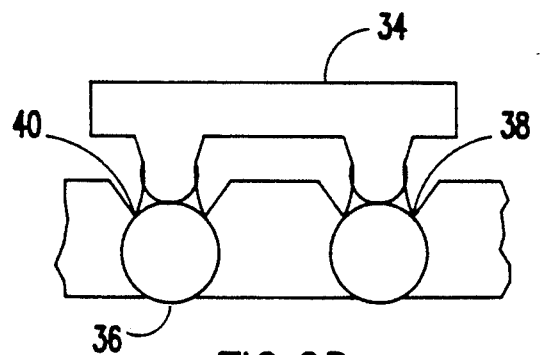

FIG. 2d shows an electronic device 34 joined to the spheres 36 in an alignment holes 38. The device 34 can be placed over the alignment holes 38 and held by a conforming surface under a controlled pressure and temperature profile which will reflow solder 40 to connect the device to the spheres 36. Flip chip technology could be readily adapted to joining devices 34 to multilayered structures 28 made by the inventive process. Moreover, the pin connector assembly described in conjunction with FIGS. 1a–b could be connected directly to the top surface of a molding/sheet 21 in a multilayer structure 28 formed according to this invention. This would provide a multilayer structure 28 with densely populated vias (spheres 22) connected to a dense pin 2 assembly where there is good chemical and mechanical connections between each layer achieved by adhesion/transesterification and good electrical connections between vias, pins and metalization between layers in the structure.

While the pin connection arrangement shown in FIGS. 1a and 1b and the multilayer circuit component shown in FIGS. 2a, 2b, 2c, and 2d show the use of a polymer layer 3 or 26 which undergoes a transesterification reaction to form a chemical bond with the substrate layers, it should be understood that the polymer layer 3 or 26 may not be used in all circumstances and that the substrate layers themselves would be chosen to undergo transesterification. Specifically, two adjacent LCP substrates (e.g., Vectra ®, etc.) will undergo transesterification under appropriate temperature and pressure conditions. By using LCP substrates with lower filler contents (e.g., approximately 20% fill, etc.), flow can be achieved below 200° C. for many LCPs.

While the invention has been described in terms of its preferred embodiments, those skilled in the art will recognize that the invention can be practiced with modification within the spirit and scope of the appended claims.

Having thus described our invention, what we claim as new and desire to secure by Letters Patent is as follows:

1. A method of electrically and mechanically joining together selected elements of an electronic device, comprising the steps of:
    positioning a polymer layer between a first and second substrate, said polymer layer being made of a first material which will undergo transesterification chemistry with a second material in or on either or both said first and second substrate;
    aligning one or more metallic elements on said first substrate with one or more metallic elements on said second substrate; and
    simultaneously forming an electrical connection between said one or more metallic elements on said first substrate with said one or more metallic elements on said second substrate, and forming a mechanical connection between said first and second substrates using said polymer layer wherein said first material and said second material undergo transesterification to form a chemical bond therebetween.

2. A method as recited in claim 1 wherein said first material is a polyester.

3. A method as recited in claim 1 wherein said second material is a liquid crystalline polyester.

4. A method as recited in claim 1 wherein said polymer layer is positioned during said positioning step such that it surrounds but not does not cover one or more metallic elements on said first substrate or said second substrate.

5. An electrical component made by the process of:
    positioning a polymer layer between a first and second substrate, said polymer layer being made of a first material which will undergo transesterification chemistry with a second material in or on either or both said first and second substrate;
    aligning one or more metallic elements on said first substrate with one or more metallic elements on said second substrate; and
    simultaneously forming an electrical connection between said one or more metallic elements on said first substrate with said one or more metallic elements on said second substrate, and forming a mechanical connection between said first and second substrates using said polymer layer wherein said first material and said second material undergo transesterification to form a chemical bond therebetween.

6. An electrical component as recited in claim 5 wherein said first substrate comprises a pinned assembly comprising a plurality of pins protruding through a first surface of said first substrate and said metallic elements on said first substrate are solder sites which are electrically connected to said pins and which are positioned on a second surface of said first substrate, and wherein said second substrate comprises an electronic device with a plurality of connection pads positioned on its surface serving as said metallic elements on said second substrate.

7. An electrical component as recited in claim 5 wherein said first and said second substrates each comprise a sheet or molding of polymeric material with a plurality of conductors pressed or molded therein, said conductors protruding from a first surface of said first and second substrates, said first and second substrates having openings formed in a second surface which extend to said conductors.

8. An electrical component as recited in claim 7 wherein said conductors have a spherical shape.

9. A method of electrically and mechanically joining together selected elements of an electronic device, comprising the steps of:
    positioning a first substrate adjacent a second substrate, said first and second substrates being made of materials which will undergo transesterification chemistry with each other;
    aligning one or more metallic elements on said first substrate with one or more metallic elements on said second substrate; and
    simultaneously forming an electrical connection between said one or more metallic elements on said first substrate with said one or more metallic elements on said second substrate, and forming a mechanical connection between said first and second substrates wherein a surface portion of each of said first and second substrates undergoes transesterification to form a chemical bond therebetween.

10. An electrical component made by the process of:
    positioning a first substrate adjacent a second substrate, said first and second substrates being made of materials which will undergo transesterification chemistry with each other;
    aligning one or more metallic elements on said first substrate with one or more metallic elements on said second substrate; and
    simultaneously forming an electrical connection between said one or more metallic elements on said first substrate with said one or more metallic elements on said second substrate, and forming a mechanical connection between said first and second substrates wherein a surface portion of each of said first and second substrates undergoes transesterification to form a chemical bond therebetween.

* * * * *